(12) United States Patent
Kurihara

(10) Patent No.: US 7,504,351 B2
(45) Date of Patent: Mar. 17, 2009

(54) ITO SPUTTERING TARGET

(75) Inventor: Toshiya Kurihara, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 189 days.

(21) Appl. No.: 10/569,068

(22) PCT Filed: Aug. 4, 2004

(86) PCT No.: PCT/JP2004/011153

§ 371 (c)(1),
(2), (4) Date: Feb. 15, 2006

(87) PCT Pub. No.: WO2005/019492

PCT Pub. Date: Mar. 3, 2005

(65) Prior Publication Data

US 2006/0289303 A1 Dec. 28, 2006

(30) Foreign Application Priority Data

Aug. 20, 2003 (JP) .............................. 2003-296077

(51) Int. Cl.
*C04B 35/01* (2006.01)
*C04B 35/65* (2006.01)
*C01G 19/02* (2006.01)

(52) U.S. Cl. ...................... 501/126; 216/101; 264/681; 423/594.9; 501/134

(58) Field of Classification Search .............. 423/594.9, 423/624; 204/298.12, 296.12; 501/126, 501/134; 216/101; 264/681
See application file for complete search history.

(56) References Cited

U.S. PATENT DOCUMENTS

| 5,980,815 A | 11/1999 | Matsunaga et al. |
| 6,106,681 A | 8/2000 | Saito et al. |
| 6,121,178 A | 9/2000 | Eshima et al. |
| 6,929,772 B2 | 8/2005 | Yanai et al. |

FOREIGN PATENT DOCUMENTS

| JP | 05-247636 A | | 9/1993 |
| JP | 05-311428 A | | 11/1993 |
| JP | 06191846 | * | 12/1994 |
| JP | 2000-345329 A | | 12/2000 |
| JP | 2003-171761 A | | 6/2003 |
| WO | 02/072912 A1 | | 9/2002 |

* cited by examiner

*Primary Examiner*—Wayne Langel
*Assistant Examiner*—James Fiorito
(74) *Attorney, Agent, or Firm*—Howson & Howson LLP

(57) ABSTRACT

Provided are an ITO sputtering target wherein the number of particles having a grain diameter of 100 nm or greater exposed in the ITO sputtering target as a result of royal water etching or sputter etching is 1 particle/$\mu m^2$, and an ITO sputtering target having a density of 7.12 $g/cm^3$ or greater capable of improving the sputtering performance, in particular inhibiting the generation of arcing, suppressing the generation of defects in the ITO film caused by such arcing, and thereby effectively inhibiting the deterioration of the ITO film.

11 Claims, 6 Drawing Sheets

ITO SPUTTERING TARGET

BACKGROUND OF THE INVENTION

The present invention relates to an ITO (compound oxide having indium and tin as primary components: $In_2O_3$—$SnO_2$) sputtering target to be used in forming an ITO film.

An ITO film is widely used as a transparent electrode (film) of a display device; mainly a liquid crystal display.

As a method of forming this ITO film, ordinarily employed is a method generally referred to as a physical vapor deposition method such as the vacuum deposition method or sputtering method. Particularly, the magnetron sputtering method is often employed for forming such ITO film from the perspective of operability and stability of the film.

The formation of film with the sputtering method is performed by physically colliding a positive ion such as Ar ion to a target established in the negative electrode, discharging materials composing the target with such collision energy, and laminating films of approximately the same composition as the target material on the substrate on the opposing positive electrode side.

The coating method employing the sputtering method is characterized in that it is capable of forming from a thin film of angstrom units to a thick film of several ten μm at a stable deposition speed by adjusting the processing time, power supply, and so on.

A particular problem in forming an ITO film is the generation of minute protrusions referred to as nodules on the target surface during the sputtering operation, which increases pursuant to the increase in sputtering time.

Nodules generate arcing during sputtering, and fragments of nodules or reducing substances of ITO become particles and are dispersed. When such dispersions adhere to the ITO film, that portion will become defective, and cause the productivity to deteriorate.

Due to the foregoing reasons, upon the actual manufacture, it is necessary to periodically remove the nodules generated on the target surface. This, however, causes problems in the considerable deterioration of productivity, and a target generating few nodules is being demanded.

Conventionally, in order to reduce nodules, the target surface was purified or smoothed, or the high densification of the target was sought. The most effective method was to uniformly disperse tin oxide in the raw material powder (e.g., refer to Patent Document 1).

As a result of this method, it is possible to reduce as much as possible the segregation in the tin oxide target having low conductivity and low sputter etching speed, and thereby reduce defects in the ITO film caused by arcing resulting from the generation of nodules.

Nevertheless, in recent years, for the advancement of high resolution of flat panel displays and improvement in the production yield of ITO films, even small defects can no longer be ignored, and demands for further reducing the arcing are increasing.

[Patent Document 1] International Publication No. WO2002072912

SUMMARY OF THE INVENTION

Thus, an object of the present invention is to provide an ITO (compound oxide having indium and tin as primary components: $In_2O_3$—$SnO_2$) sputtering target capable of inhibiting the generation of arcing in the sputtering process of forming a transparent electrode film or the like, suppressing the generation of defects of the ITO film caused by such arcing, and reducing the formation of nodules and abnormal discharge.

The present invention provides:
1. An ITO sputtering target wherein the number of particles having a grain diameter of 100 nm or greater exposed in the ITO sputtering target as a result of royal water etching or sputter etching is 1 particle/μm² or less;
2. An ITO sputtering target wherein the number of particles having a grain diameter of 100 nm or greater exposed in the ITO sputtering target as a result of royal water etching or sputter etching is 0.2 particles/μm² or less;
3. The ITO sputtering target according to claim 1, wherein the number of particles having a grain diameter of 100 nm or greater exposed in the ITO sputtering target as a result of royal water etching or sputter etching is 0.02 particles/μm² or less;
4. The ITO sputtering target according to any one of claims 1 to 3, wherein particles having a grain diameter of 1 μm or greater exposed as a result of royal water etching or sputter etching do not exist in the target;
5. The ITO sputtering target according to claim 4, wherein particles having a grain diameter of 100 nm or greater exposed as a result of royal water etching or sputter etching do not exist in the target.
6. The ITO sputtering target according to claim 5, wherein particles having a grain diameter of 10 nm or greater exposed as a result of royal water etching or sputter etching do not exist in the target; and
7. The ITO sputtering target according to any one of claims 1 to 6, wherein the density is 7.12 g/cm³ or greater.

[Effect of the Invention]

As a result of using the ITO target of the present invention, a significant effect is yielded in that the generation of arcing can be inhibited in the sputter deposition process, defects in the ITO film caused by such arcing can be suppressed, and deterioration in the ITO film can be inhibited as a result thereof.

DETAILED DESCRIPTION OF THE INVENTION

In order to realize the further reduction of arcing, as a result of conducting a detailed observation of the sputtered face of the ITO target, the present inventors discovered that etching via sputtering is not conducted uniformly on the target surface, and that microstructures having a size of roughly 500 nm or less and having a comparatively slow etching speed exist inside grains.

Figure 1:
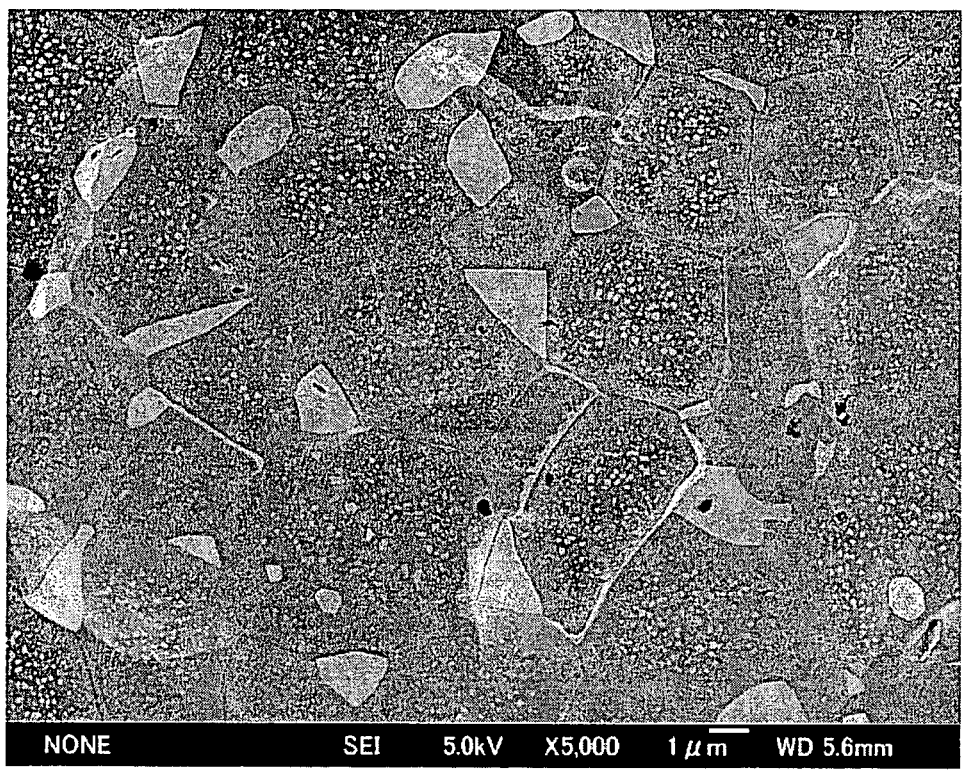
FIG. 1 is an SEM image (magnification of 5000) of the sputtered surface of an ITO target in which the sintering temperature is high (1550 to 1600° C.)
Figure 2:
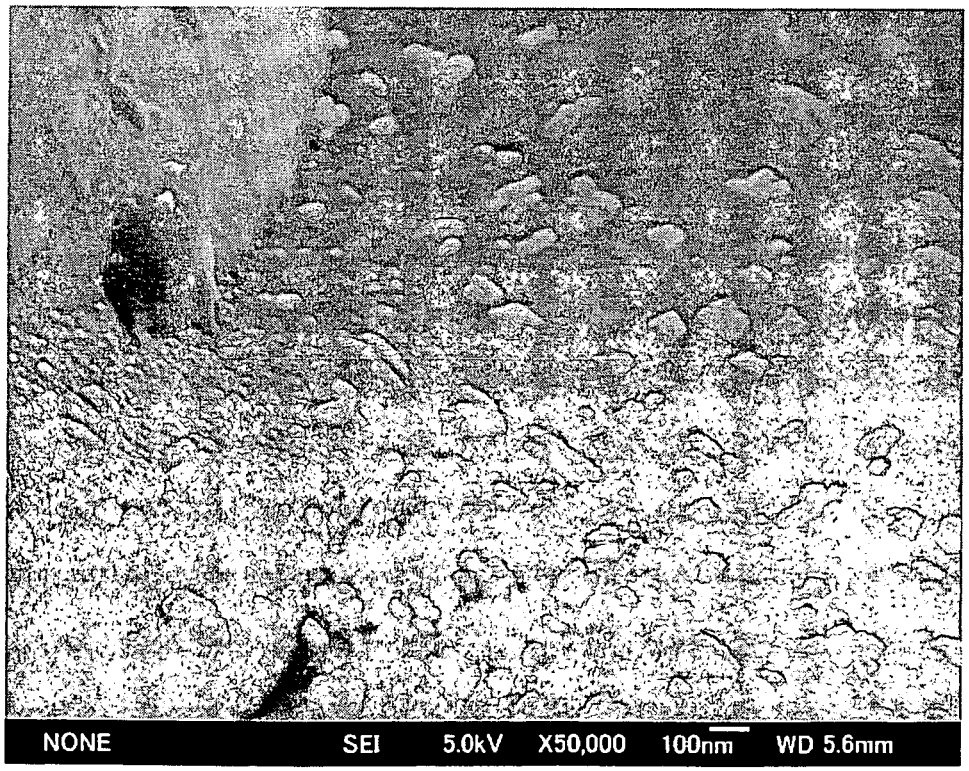
FIG. 2 is an SEM image (magnification of 50000) of the inner-granular microstructures of an ITO target in which the sintering temperature is high (1550 to 1600° C.) and the sputter etching speed is slow.

FIG. 1 and FIG. 2 show an SEM image of the ITO target surface etched via sputtering. In FIG. 1, minute grains can be observed in the crystalline structure shown with magnification of 5000 structure. FIG. 2 is an enlargement thereof at magnification of 50000.

In particular, the minute particles of 100 nm or less observed in FIG. 2 is considered to be an area with high tin content. These minute particles have a slower etching speed in comparison to other structures. Thus, these minute particles are left behind during sputtering, and it is easy to image that these are either discharged from the target as foreign matter, or generate minute arcing and thereby cause defects in the ITO film.

As a result of conducting further study on these inner-granular microstructures, it has become evident that such microstructures are not caused by the non-uniformity (segregation) of tin oxide in the raw material powder, but are rather substances arising in the normal manufacturing method of an ITO sintered body.

Further, with an ITO in which the tin oxide composition is 10. wt. % and which most generally used for flat panel displays, the condition of these microstructures depends on the maximum temperature during sintering, and it has become clear that the higher the sintering temperature, the larger the particles, and the number of particles would increase as a result thereof.

Further, even if the sintering temperature is the same, it has become clear that lower the tin oxide composition, the smaller the particles. Therefore, in order to reduce or minify the minute particles having a slow etching speed, it is necessary to lower the sintering temperature, or to reduce the tin oxide composition. Nevertheless, if the sintering temperature is lowered, sintering cannot be performed sufficiently, and it will be difficult to increase the density of the ITO target.

An ITO target having a low density generates nodules and arcing during sputtering, and fragments of nodules or reducing substances of ITO become particles and are dispersed. When such dispersions adhere to the ITO film, that portion will become defective, and cause the productivity to deteriorate.

Therefore, not only lowering the sintering temperature, but also not lowering the sintering density is necessary.

Generally, an ITO sintered body is obtained by mixing indium oxide powder and tin oxide powder as the raw materials to become a prescribed composition, molding this, and sintering the obtained compact in an oxygen atmosphere.

In order to decrease the sintering temperature without lowering the sintering density, it is necessary to sufficiently examine the processes, and improve the sinterability. Thus, the indium oxide powder and tin oxide powder as the raw materials must have an appropriate specific surface area.

Further, oxide raw material powder or the mixed powder thereof must be dry- or wet-pulverized to increase the specific surface area. Thereby, the sinterability of the raw material powder is improved even more, and it becomes easier to increase the sintering density even with a low sintering temperature.

Moreover, upon obtaining a compact from raw material powder, it is necessary to obtain a high density compact by using cold isostatic pressing (CIP) and to adopt a compact retention method where the oxygen atmosphere will get across the entire compact during sintering.

Further, it is necessary to take particular note on the holding time during the maximum temperature in sintering. If the holding time during the maximum temperature is too short, a high sintering density cannot be obtained, and, if this is too long, it will assist in the growth of particles, and an appropriate holding time must be adopted. In other words, the lower limit of holding time during the maximum sintering temperature is limited based on the sintering density, and the upper limit thereof is limited based on the size of particles.

Figure 3:
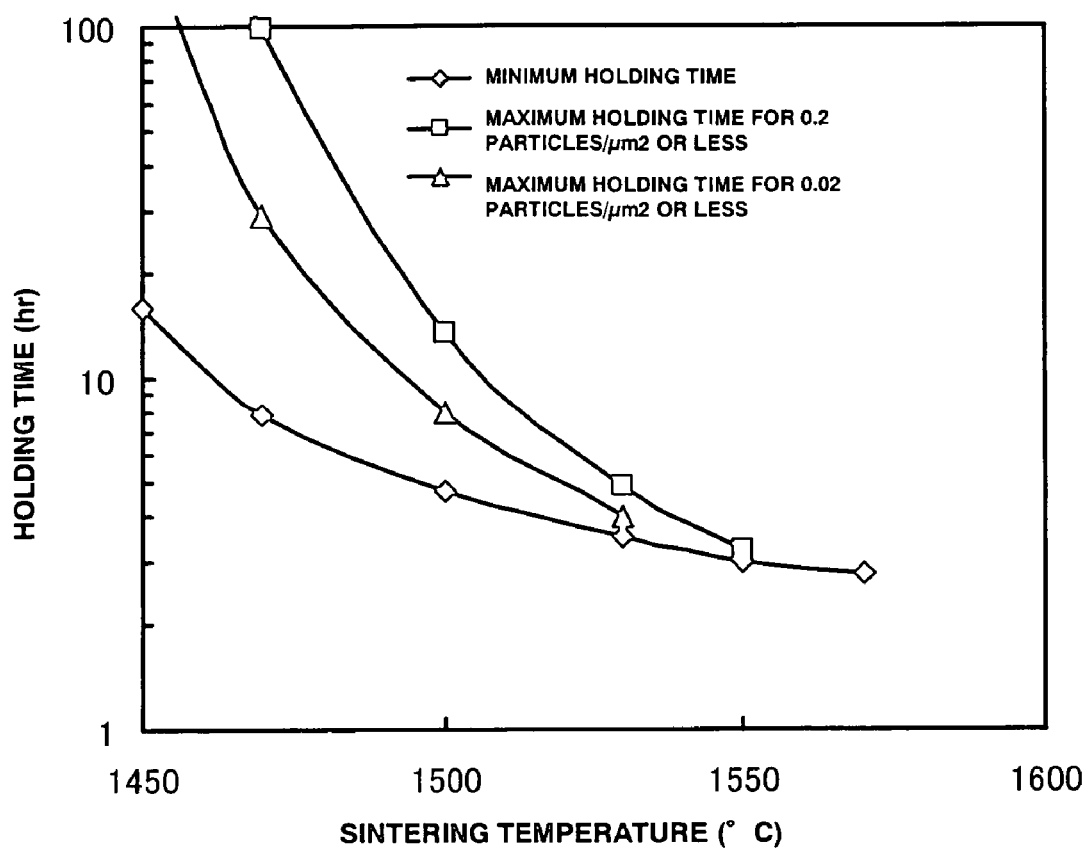
FIG. 3 is a diagram showing the sintering temperature dependency of the minimum retention time (○) in which the sintering density becomes 7.12 g/cm³ or greater, maximum retention time (□) in which the number of particles of 100 nm or greater exposed as a result of royal water etching is 0.2 particles/μm² or less, and maximum retention temperature (Δ) in which the number of particles becomes 0.02 particles/μm² or less.

FIG. 3 shows the scope of sintering conditions of a sintered body prepared using the raw material powder with improved sinterability with the method described above in which the number of particles of 100 nm or greater exposed as a result of royal water etching is 0.2 particles/$\mu m^2$ or less and the sintering density becomes 7.12 g/cm$^3$ or greater, and the sintering conditions in which the number of particles of 100 nm or greater exposed as a result of royal water etching is 0.02 particles/$\mu m^2$ or less and the sintering density becomes 7.12 g/cm$^3$ or greater.

With the sintering temperature being less than 1450° C., it was not possible to obtain a sintered body having a density of 7.12 g/cm$^3$ or greater. With the sintering temperature exceeding 1550° C., it was not possible to obtain a sintered body in which the number of particles of 100 nm or greater exposed as a result of royal water etching is 0.2 particles/$\mu m^2$ or less.

As shown in FIG. 3, if the sintering temperature is low, although it will be easy to obtain a sintered body having few particles that are 100 nm or greater, the sintering time will be long in order to obtain a sintering density of 7.12 g/cm$^3$ or greater, and the productivity will deteriorate. Further, if the sintering temperature is high, although it will be easy to obtain a high density sintered body, the sintering conditions for obtaining a sintered body with few particles that are 100 nm or greater will become narrow, and the level of defectiveness will increase. The sintering conditions during actual production should be decided in consideration of the above.

Further, even if the sintering temperature is the same, the lower the tin oxide composition, the smaller the particles, but it becomes difficult to increase the sintering density. Moreover, characteristics of the ITO film prepared from such a target will change significantly.

Therefore, simply reducing the tin oxide composition will not be sufficient, and it is desirable that the lower limit there is 8.5 wt. % or higher, and more desirably 9.0 wt. % or higher.

Incidentally, even in etching (25° C. for 3 minutes) using royal water (volume ratio is HCl: HNO$_3$:H$_2$O=1:0.08:1), microstructures having a slow etching speed as with the etching surface via sputtering will become exposed. Therefore, the etching surface using royal water is the same as the etching surface via sputter etching. Since similar results can be obtained by preparing a small tablet shaped sample and subjecting this to royal water etching, the time required for evaluating the etching face can be shortened than by producing a target and subjecting this to sputter etching.

Figure 4:
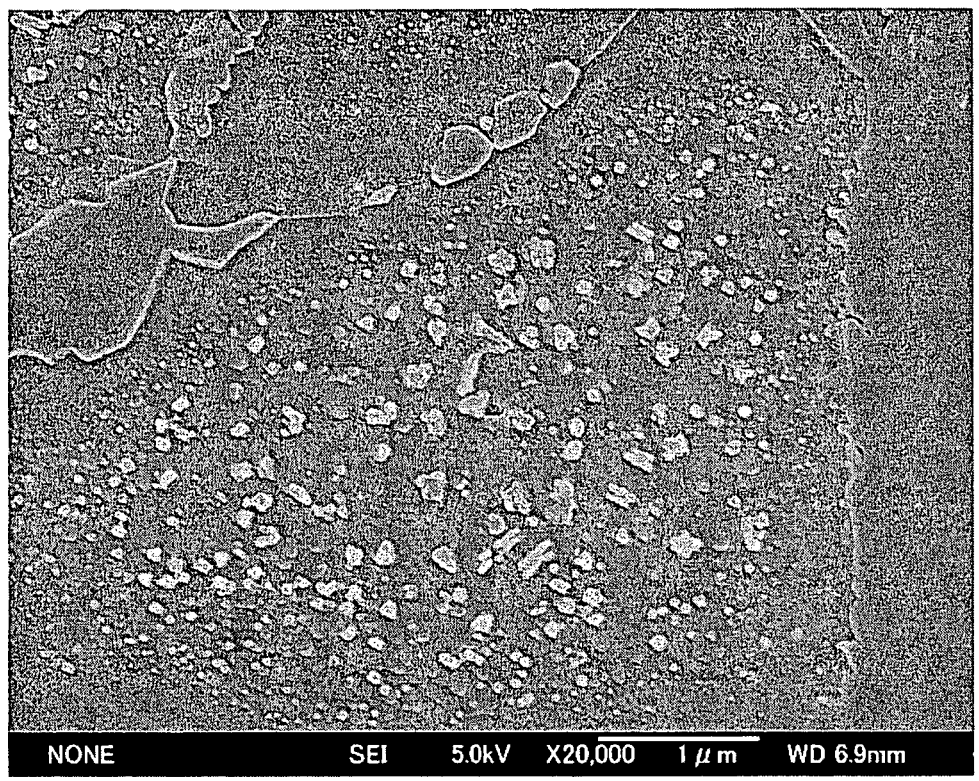
FIG. 4 is an SEM image (magnification of 20000) of inner-granular microstructures of an ITO target in which the sintering temperature is high (1550 to 1600° C.)

FIG. 4 is an SEM image of the surface of the ITO target sintered at a maximum temperature of 1550 to 1600° C., and thereafter subject to royal water etching. Numerous minute particles of 100 nm or greater exist after the etching. In order to reduce such minute particles, it is necessary to change the sintering conditions or the tin oxide composition.

The present invention, in light of the foregoing circumstances, enables the number of particles having a grain diameter of 100 nm or greater existing in the ITO sputtering target exposed as a result of royal water etching or sputtering etching to be 1 particle/$\mu m^2$ or less. As a result, it is possible to considerably reduce the generation of arcing in comparison to conventional targets.

Further, it is desirable to make the number of particles having a grain diameter of 100 nm or greater existing in the ITO sputtering target exposed as a result of royal water etching or sputtering etching to be 0.2 particles/$\mu m^2$ or less.

Moreover, further still, it is desirable to make the number of particles having a grain diameter of 100 nm or greater existing in the ITO sputtering target exposed as a result of royal water etching or sputtering etching to be 0.02 particles/$\mu m^2$ or less.

In addition, it is preferable that particles having a grain diameter of 1 $\mu m$ or greater exposed as a result of royal water etching or sputter etching do not exist in the target, preferably particles having a grain diameter of 100 nm or greater do not exist in the target, and more preferably particles having an average grain size of 10 nm or greater do not exist in the target. As a result, it is possible to reduce the generation of arcing as much as possible.

As shown in FIG. 3, if the sintering temperature is low, although it will be easy to obtain a sintered body having few particles that are 100 nm or greater, the sintering time will be long in order to obtain a sintering density of 7.12 g/cm$^3$ or greater, and the productivity will deteriorate. Further, if the sintering temperature is high, although it will be easy to obtain a high density sintered body, the sintering conditions for obtaining a sintered body with few particles that are 100 nm or greater will become narrow, and the level of defectiveness will increase. The sintering conditions during actual production should be decided in consideration of the above.

Figure 5:
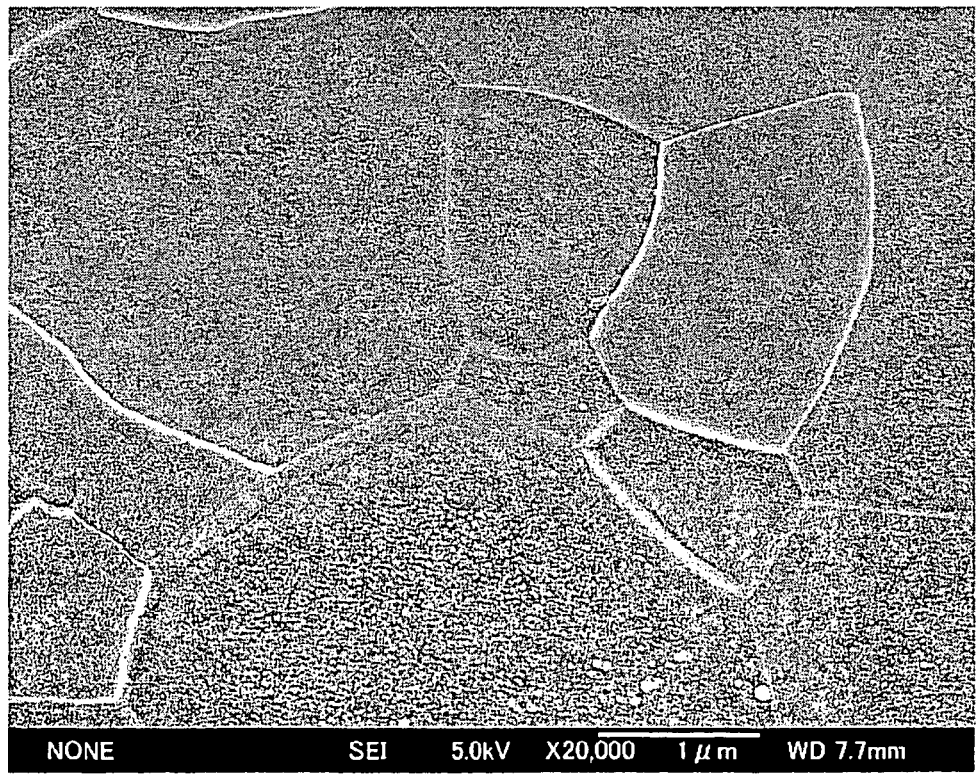
FIG. 5 is an SEM image (magnification of 20000) of inner-granular microstructures of an ITO target in which the sintering temperature is low (1470 to 1500° C.)

FIG. 5 is an SEM image of the surface of the ITO target sintered at a maximum temperature of 1470 to 1550° C., and thereafter subject to sputter etching.

An ITO sintered at a low temperature clearly has a smooth surface with no inner-granular microstructures of low etching speed, or which are extremely minute at 100 nm or less.

As shown with the sintering conditions of FIG. 3, microstructures of roughly 100 nm can be confirmed at a maximum sintering temperature of 1550° C. or higher, and can hardly be observed at a maximum sintering temperature of 1550° C. or less, and it can no longer be observed at a temperature of 1470° C. or less.

As described above, by performing sputtering with an ITO target having no inner-granular microstructures of a low etching speed or which are extremely minute having an average grain size of 100 nm or less, it is possible to effectively inhibit the generation of arcing in comparison to conventional targets, suppress the generation of particles caused by such arcing, and effectively inhibit the deterioration of the ITO film.

EXAMPLES

Examples of the present invention are now explained. These Examples are merely illustrative, and the present invention shall in no way be limited thereby. In other words, the present invention shall only be limited by the scope of the present invention, and shall include the various modifications other than the Examples of this invention.

Examples 1 to 3

After mixing indium oxide powder 90 wt. % and tin oxide powder 10 wt %, this was pulverized with a bead mill in wet process until the increase of the specific surface area became 2.5 m$^2$/g, and then a binder was added and dried. This dry powder was press molded at a pressure of 500 kgf cm$^2$, and this was further subject to cold isostatic pressing (CIP) of 2 ton/cm$^2$ in order to obtain a compact of 650×180×9 mm.

Those compacts were sintered in an oxygen atmosphere at a maximum temperature of 1470° C. to 1500° C. so as to satisfy the sintering conditions shown in FIG. 3, and the obtained sintered bodies were subject to machining in order to obtain ITO targets.

Figure 6:
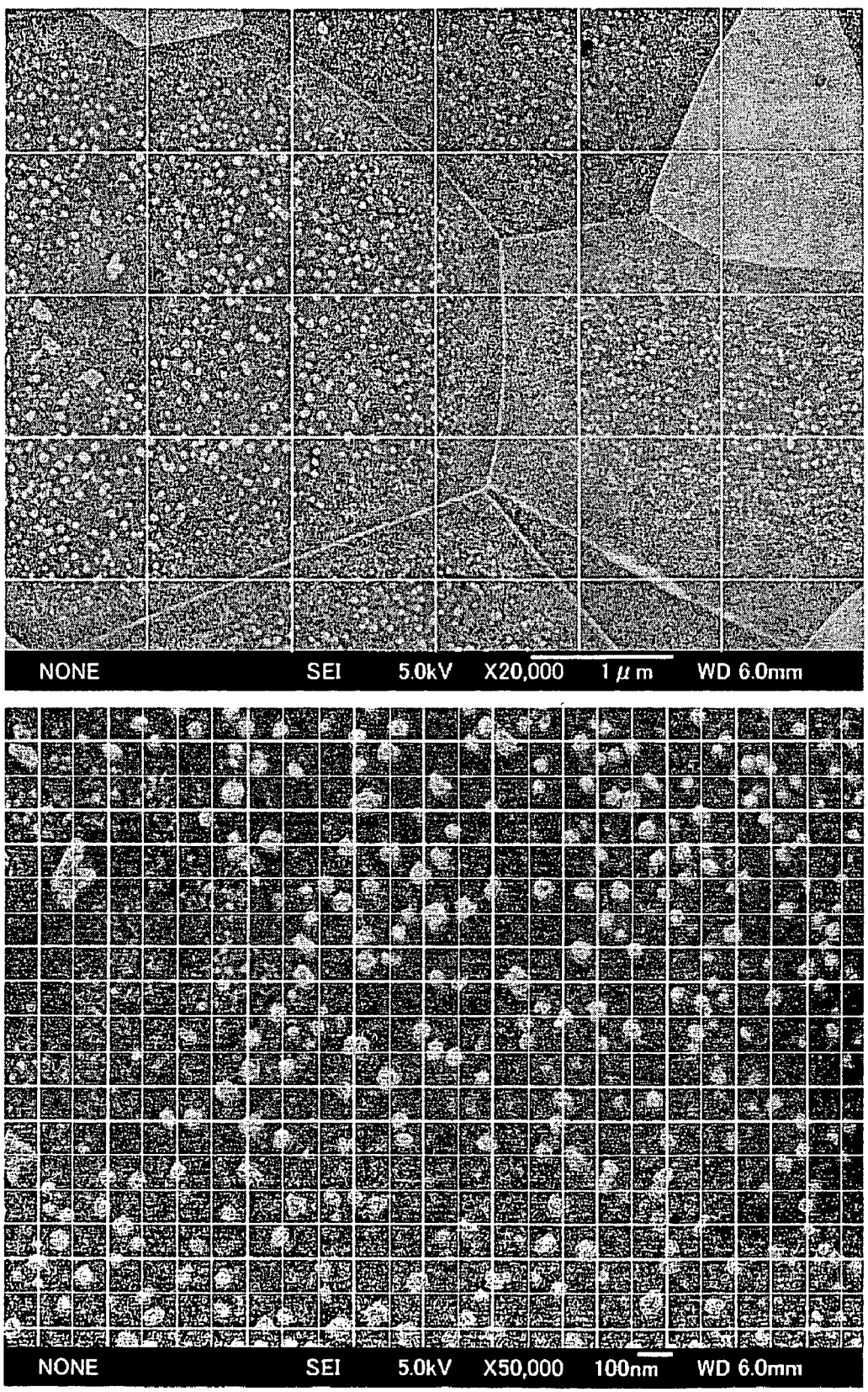
FIG. 6 is an SEM image (magnification of 20000, magnification of 50000) of the sintered body used in Example 2.

The target density was respectively 7.129, 7.130 and 7.132 g/cm$^3$. The number of particles having a grain diameter of 100 nm or greater exposed as a result of royal water etching was respectively 0.02, 0.19, and 0.80 particles/$\mu m^2$. FIG. 6 shows an SEM image of the etched face of the 0.19 particles/$\mu m^2$.

Next, these sintered targets were used to form a transparent electrode film under the following conditions by performing DC magnetron sputtering to a glass substrate.

Figure 8:
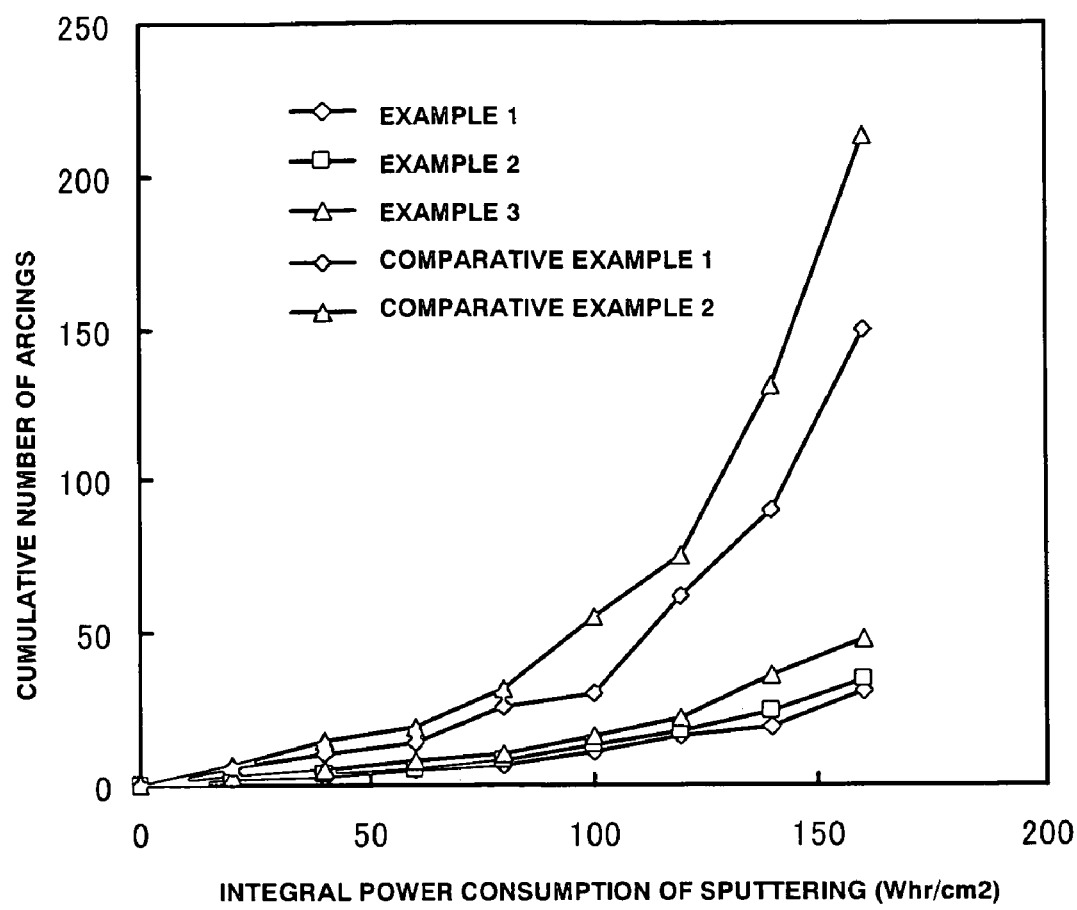
FIG. 8 is a diagram showing the accumulated number of arcings during the sputtering of the ITO target used in the Examples and Comparative Examples.

Sputter gas: Ar+O$_2$ (99:1)
Sputter gas pressure: 0.5 Pa
Electric energy: 60 W
Sputter output: 0.5 W/cm$^2$ As a result of the above, the integral power consumption of sputtering was discharged up to 160 Whr/cm$^2$. The generation (coverage) of nodules in this was measured, and the coverage of nodules on the target face was respectively 0.12%, 0.11% and 0.09%. Further, the number of accumulated arcings in which the discharge energy is 10 mJ or less was respectively 31, 35 and 48. The solid line in FIG. 8 shows the change in the number of accumulated arcings pursuant to the integral power consumption of the Examples.

Comparative Example 1, 2

The compacts obtained with the same method as Examples 1 to 3 were sintered in an oxygen atmosphere at a maximum temperature of 1530° C. to 1620° C. so as to be outside the sintering conditions shown in FIG. 3, and the obtained sintered bodies were subject to machining in order to obtain ITO targets.

Figure 7:
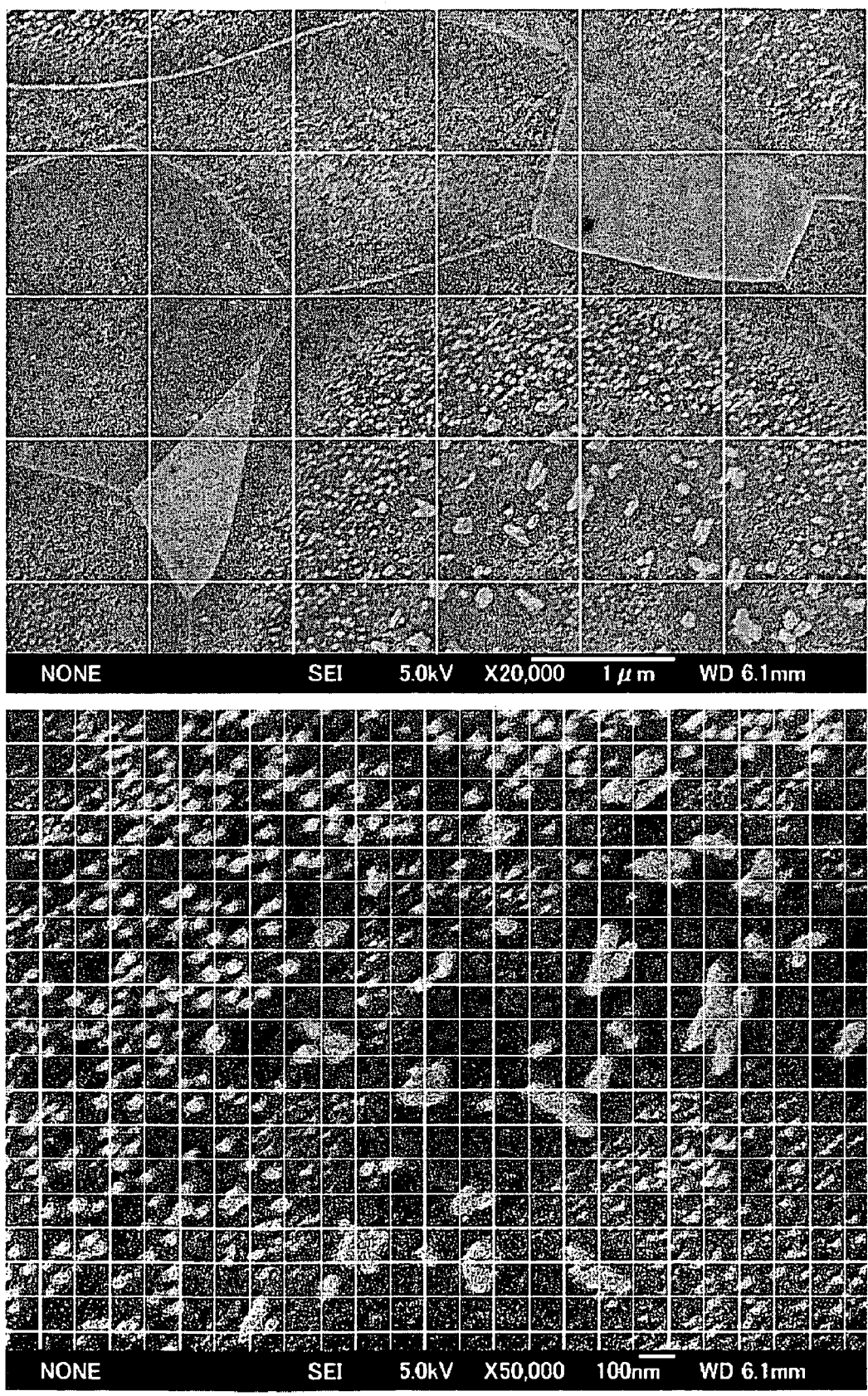
FIG. 7 is an SEM image (magnification of 20000, magnification of 50000) of the sintered body used in Comparative Example 1.

The target density was respectively 7.132 g/cm$^3$ and 7.133 g/cm$^3$. The number of particles having a grain diameter of 100 nm or greater exposed as a result of royal water etching was respectively 1.1 particles/$\mu m^2$ and 1.3 particles/$\mu m^2$. FIG. 7 shows an SEM image of the etched face of the 1.1 particles/$\mu m^2$.

This target was used to conduct a discharge test with DC magnetron sputtering under the same conditions as Example 1 until the integral power consumption of sputtering became 160 Whr/cm$^2$, and the coverage of nodules on the target surface was respectively 0.11% and 0.12%.

Further, the number of accumulated arcings in which the discharge energy is 10 mJ or less was 150 and 213. The dotted line in FIG. 8 shows the change in the number of accumulated arcings pursuant to the integral power consumption of the Comparative Examples.

As shown in FIG. 8, the number of accumulated arcings of Examples 1 to 3 is clearly superior to that of the Comparative Examples.

Table 1 shows a list of the target density, number of particles that are 100 μm or greater, nodule coverage during sputtering, and number of arcings of Examples 1 to 3 and Comparative Examples 1 and 2 of the present invention.

The ITO target of the present invention yields a superior effect in that it is able to inhibit the generation of arcing, suppress the generation of defects in the ITO film caused by such arcing, and inhibit the deterioration of the ITO film.

TABLE 1

| Sample | Density (g/cm³) | Number of Particles 100 nm or Larger (particles/μm²) | Nodule Coverage (%) | Number of Arcings (number of times) |
|---|---|---|---|---|
| Example 1 | 7.129 | 0.015 | 0.12 | 31 |
| Example 2 | 7.130 | 0.19 | 0.11 | 35 |
| Example 3 | 7.132 | 0.80 | 0.09 | 48 |
| Comparative Example 1 | 7.132 | 1.10 | 0.11 | 150 |
| Comparative Example 2 | 7.133 | 1.30 | 0.12 | 213 |

The invention claimed is:

1. An ITO sputtering target having a density of 7.12g/cm³ or greater and wherein the number of particles having a diameter of 100 nm or greater and being exposed on a surface of the ITO sputtering target by royal water etching or sputter etching is 1 particle/μm² or less and wherein particles having a diameter of 1 μm or greater do not exist on the etched surface of the target.

2. The ITO sputtering target according to claim 1, wherein the number of particles having a diameter of 100 nm or greater and being exposed on the surface of the ITO sputtering target by royal water etching or sputter etching is 0.02 particle/μm² or less.

3. An ITO sputtering target according to claim 1, wherein said etched surface of said ITO sputtering target has a crystalline structure with minute grains, and wherein said particles are minute particles that are located within the minute grains, that have slower etching speed relative to adjacent areas of the surface of the target, and that form inner granular microstructures on said etched surface of said minute grains due to said slow etching speed.

4. An ITO sputtering target according to claim 3, wherein said minute particles have higher tin content relative to adjacent areas of the surface of the target.

5. An ITO sputtering target having a density of 7.12 g/cm³ or greater and wherein the number of particles having a diameter of 100 nm or greater and being exposed on a surface of the ITO sputtering target by royal water etching or sputter etching is 0.2 particle/μm² or less and wherein particles having a diameter of 1 μm or greater do not exist on the etched surface of the target.

6. An ITO sputtering target according to claim 5, wherein said etched surface of said ITO sputtering target has a crystalline structure with minute grains, and wherein said particles are minute particles that are located within the minute grains, that have slower etching speed relative to adjacent areas of the surface of the target, and that form inner granular microstructures on said etched surface of said minute grains due to said slow etching speed.

7. An ITO sputtering target according to claim 6, wherein said minute particles having slow etching speed have higher tin content relative to adjacent areas of the surface of the target.

8. An ITO sputtering target having a density of 7.12 g/cm³ or greater and wherein said ITO sputtering target has no particle having a diameter of 100 nm or greater exposed on a surface of the ITO sputtering target by royal water etching or sputter etching.

9. An ITO sputtering target according to claim 8, wherein the etched surface of said ITO sputtering target has a crystalline structure with minute grains, and wherein said particle not present on the etched surface is one that has a diameter of 100 nm or greater, that is located on the etched surface within one of the minute grains, that has slower etching speed relative to adjacent areas of the surface of the target, and that forms inner granular microstructures on said etched surface.

10. An ITO sputtering target having a density of 7.12 g/cm³ or greater and wherein said ITO sputtering target has no particle having a grain diameter of 10 nm or greater exposed on a surface of the ITO sputtering target by royal water etching or sputter etching.

11. An ITO sputtering target according to claim 10, wherein the etched surface of said ITO sputtering target has a crystalline structure with minute grains, and wherein said particle not present on the etched surface is one that has a diameter of 10 nm or greater, that is located on the etched surface within one of the minute grains, that has slower etching speed relative to adjacent areas of the surface of the target, and that forms inner granular microstructures on said etched surface.

* * * * *